US007535248B2

(12) United States Patent
Chen et al.

(10) Patent No.: US 7,535,248 B2

(45) **Date of Patent: *May 19, 2009**

(54) SYSTEM FOR DISPLAY TEST

(75) Inventors: Chang-Yu Chen, Kao-Hsiung (TW); Kuan-Yun Hsieh, Taichung (TW); Jian-Shen Yu, Hsin-Chu (TW); Yi-Ping Chen, Ping-Dong (TW)

(73) Assignee: AU Optronics, Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/862,142

(22) Filed: Sep. 26, 2007

(65) Prior Publication Data

US 2008/0061815 A1 Mar. 13, 2008

Related U.S. Application Data

(62) Division of application No. 11/228,644, filed on Sep. 15, 2005, now Pat. No. 7,298,164.

(30) Foreign Application Priority Data

Feb. 25, 2005 (TW) .............................. 94105747 A

(51) Int. Cl.
*G01R 31/00* (2006.01)

(52) U.S. Cl. .................................... 324/770; 324/158.1

(58) Field of Classification Search ....................... None
See application file for complete search history.

(56) References Cited

U.S. PATENT DOCUMENTS

| | | | | |
|---|---|---|---|---|
| 5,034,735 | A * | 7/1991 | Inoue et al. | 345/96 |
| 5,576,730 | A * | 11/1996 | Shimada et al. | 345/98 |
| 5,825,196 | A | 10/1998 | Irie et al. | |
| 6,028,442 | A | 2/2000 | Lee et al. | |
| 6,265,889 | B1 | 7/2001 | Tomita et al. | |
| 6,310,594 | B1 | 10/2001 | Libsch et al. | |
| 6,337,722 | B1 | 1/2002 | Ha | |
| 6,750,926 | B2 | 6/2004 | Ohgiichi et al. | |
| 6,798,232 | B2 | 9/2004 | Lim | |
| 6,831,624 | B1 | 12/2004 | Harrold | |
| 6,873,174 | B2 | 3/2005 | Matsunaga et al. | |
| 6,879,179 | B2 | 4/2005 | Fujita | |
| 6,924,874 | B2 * | 8/2005 | Lin et al. | 349/187 |
| 6,924,875 | B2 | 8/2005 | Tomita | |
| 6,940,300 | B1 | 9/2005 | Jenkins et al. | |
| 6,982,568 | B2 * | 1/2006 | Nojiri et al. | 324/770 |
| 7,342,410 | B2 * | 3/2008 | Hsieh et al. | 324/770 |
| 2002/0047838 | A1 | 4/2002 | Aoki et al. | |
| 2005/0046439 | A1 | 3/2005 | Yu | |
| 2005/0057273 | A1 | 3/2005 | Lin et al. | |
| 2005/0212782 | A1 | 9/2005 | Brunner | |

* cited by examiner

*Primary Examiner*—Paresh Patel
(74) *Attorney, Agent, or Firm*—Squire, Sanders & Dempsey, L.L.P.

(57) ABSTRACT

The system for display test includes a driving circuit having integrated circuit (IC) pads on the substrate and the IC pads are electrically connected to the signal lines, respectively. And the first switches are between the first test pads and the IC pads, wherein the number of the first test pads is less than the number of the IC pads.

10 Claims, 5 Drawing Sheets

SYSTEM FOR DISPLAY TEST

This application is a division of U.S. patent application Ser. No. 11/228,644, filed Sep. 15, 2005 now U.S. Pat. No. 7,298, 164.

BACKGROUND OF THE INVENTION

The present invention relates to a test circuit of the display and, more particularly, to a test circuit of the liquid crystal display (LCD).

DESCRIPTION OF THE PRIOR ART

There is two mainly test structures in the traditional thin-film transistor liquid-crystal display (TFT-LCD): one is full contact test and the other is shorting bar test.

The FIG. 1 is a traditional structure of the full contact test. The test circuit includes a plurality of scanning lines 101 and a plurality of data lines 102, and the scanning lines and the data lines are vertically crossed each other. The test structure includes two input signals to test the circuit; one is an image signal 103 and the other is a scanning signal 104, and these two signals test the circuit by the respective test points 105 and 105'. The working mode is when the scanning signal 104 opens one of the scanning lines 101, the image signal tests the points between the previous scanning line and each data lines 102 one by one. Even the full contact test can receive the whole test information, it is necessary to have different test platform when the size of the panels is different. The cost of production is increased and this is a big limitation of the production of the smallest corrective structure in the test platform, such as the full contact test.

The FIG. 2 is a traditional structure of the shorting bar test. Wherein the test structure is the same as the previous test structure, and also includes a plurality of scanning lines 201 and a plurality of data lines 202. And there are two input signals in the test structure: the image signal 203 and the scanning signal 204. These two signals test the circuit by the respective test point 205 and 205'. The difference is the shorting bar used a fixed amount of the data lines to connect the metal lines 206 and 206' in the production process, and improve the problem that the accuracy is not enough in the test platform. There is a shorting bar test method disclosed in the U.S. patent application Ser. No. 5,825,196. At first, the first sub-pixel is connected to the first shorting bar, the second sub-pixel is connected to the second shorting bar, the third sub-pixel is connected to the third shorting bar, and then the signal is provided only to the first shorting bar. This picture is showing the color what the first sub-pixel should be displayed. And the signal is provided to the second shorting bar and the third shorting bar in sequence. Therefore, the drawback can be found. However, the simplification of the design causes the detail of the picture cannot be tested. The completeness of the test value is questionable. Moreover, after the test is done, the places of short must be opened by laser or other methods. It will increase the burden of the production process and has unpredictable result.

According to the previous description, it is necessary to have a test structure used in the display device. It can have accurate test by the need, and solve the problem of the difficulty of the productive standard in the prior art.

SUMMARY OF THE INVENTION

The purpose of the present invention is to provide a test system in a display device, and achieve the sharing of the test platform by the design of the multiplex control circuit.

Another purpose of the present invention is to provide a test system and achieve the accurate test, such as full contact test or fast test like shorting bar, of a display device.

The other purpose of the present invention is to avoid the use of the laser-cutting process and increase the reliability of the production process.

According to the purposes described above, a display provided in the present invention, which comprises a plurality of data lines, a driving circuit, a plurality IC pads electrically connected to a plurality data lines, a plurality test points electrically connected to the IC pads, and a plurality of switches electrically connected to the test points and the IC pads, wherein the numbers of the test points are less than that of the IC pads.

BRIEF DESCRIPTION OF THE DRAWINGS

The accompany drawings incorporated in forming a part of the specification illustrate several aspects of the present invention, and together with the description serve to explain the principles of the present invention. In the drawings.

DESCRIPTION OF THE PREFERRED EMBODIMENT

The following is the detail description of the present invention. It should be noted and appreciated that the process steps and structures described below do not cover a complete process flow and structure. The present invention can be practiced in conjunction with various fabrication techniques that are used in the art, and only so much of the commonly practiced process steps are included herein as are necessary to provide an understanding of the present invention.

The test system of the display of the present invention includes a plurality of first test points in the substrate and is electrically connected to the driving circuit. Wherein the driving circuit is electrically connected to a plurality of signal lines, and a plurality of first test points are respectively passed through the switches and are electrically connected to the second test points. The numbers of the second test points are less than which of the first test points. After the test was done, there is an input signal into the switch to turn off the connection between the test point and the driving circuit. Another application of the present invention is a driving circuit with a plurality of IC pads passed through the switches and connected to the test points. The numbers of the test points are less than the numbers of the IC pads.

Figure 1:
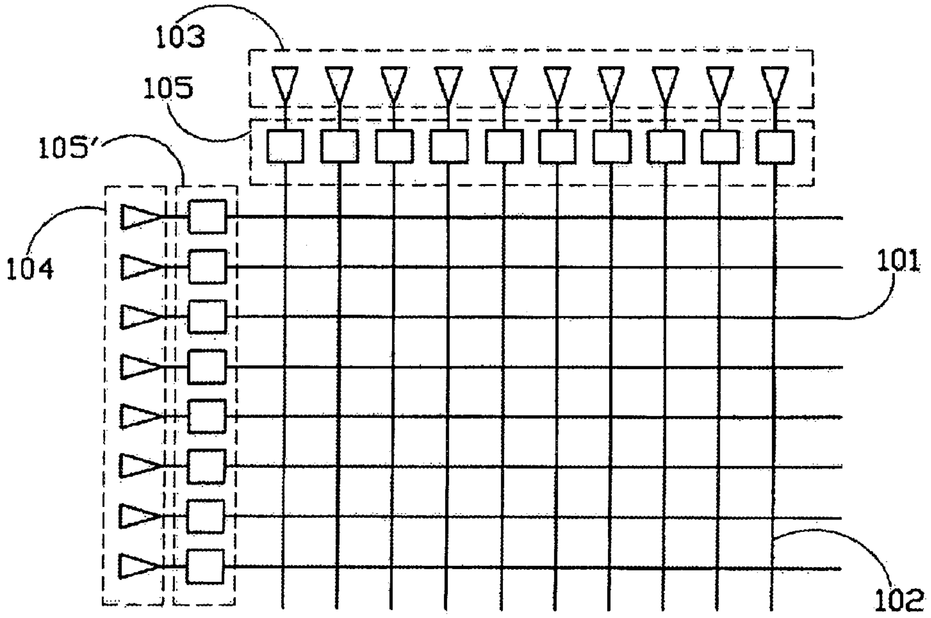
FIG. 1(Prior Art)
FIG. 1 is a view drawing illustrating a full contact structure of a traditional liquid crystal display (LCD).
Figure 2:
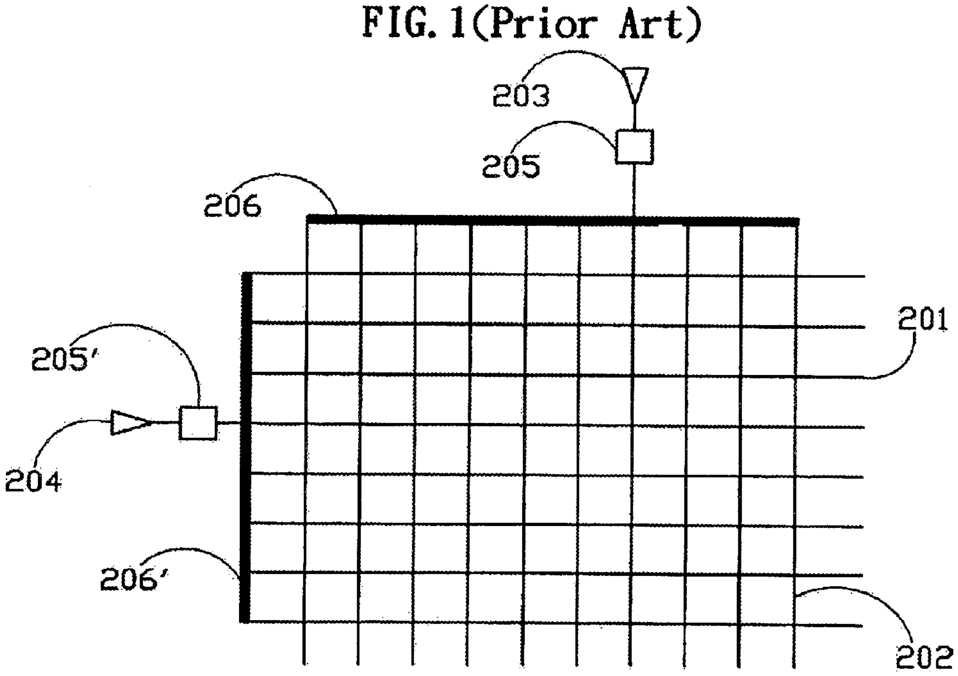
FIG. 2(Prior Art)
FIG. 2 is a view drawing illustrating a shorting bar structure of a traditional liquid crystal display (LCD).
Figure 3:
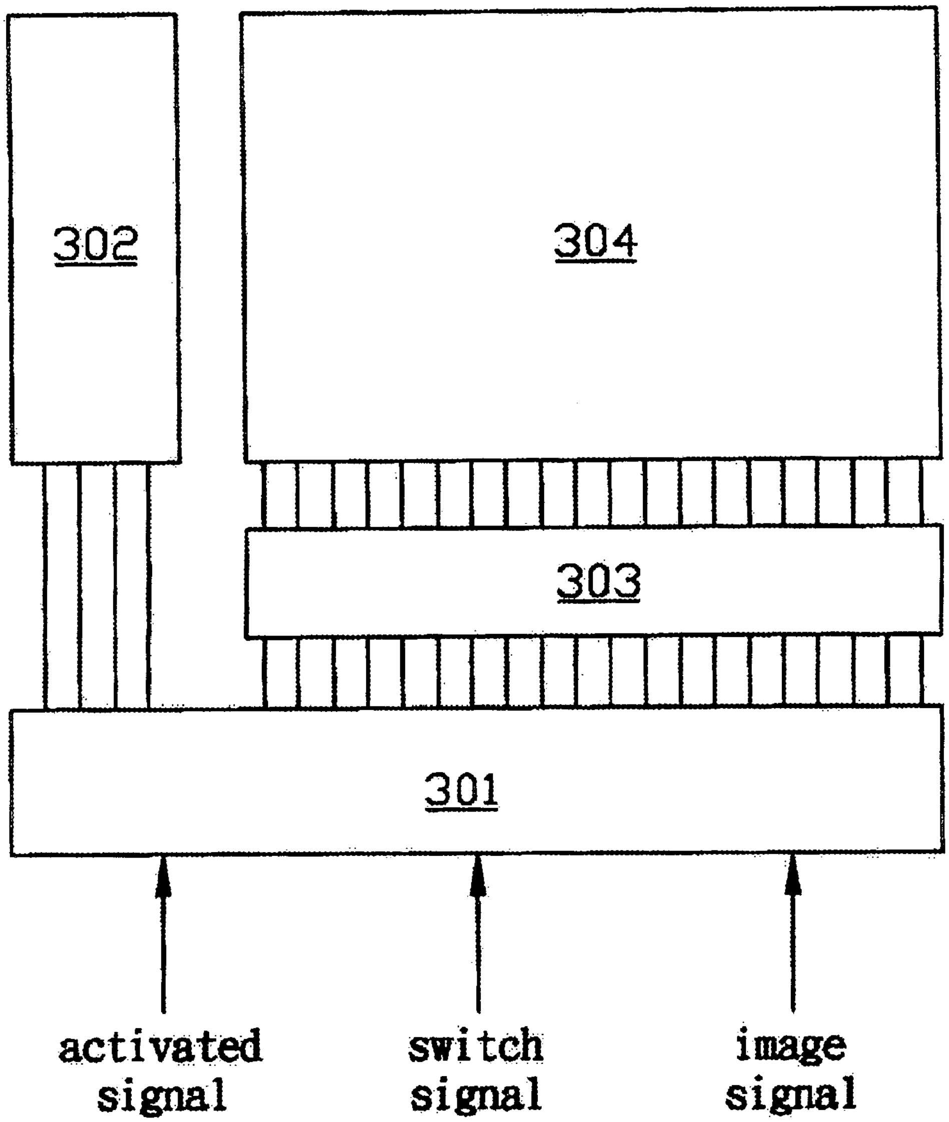
FIG. 3 is a view drawing illustrating a test system of the present invention.

One of the embodiments of the present invention is showing a test system of a display in FIG. 3. The driving circuit is connected to the picture display region 304 to transfer the image signals by the chosen test points. The choice of the test point is based on the need of the users. For example, when the user needs higher quality test, there are more test points being used. When the user considers the cost of the test, there are less test points being used. It should be noted that the multiplex control circuit 301 is not intended to limit at here. It could be a combination of a plurality of the multiplex control circuit, and there is at least one path to transfer the image signal to the test point and switch in each multiplex control circuit. And each image signal can be transferred to the multiplexer 303 and the multiplex control circuit 301 can provide a perfect interface, which is used to drive and switch signals and respectively transfer to the scanning driving circuit 302 and the multiplexer 303. The scanning driving circuit 301 is disposed in the glass plate and provides the parallel scanning and sequence signals by the driving signal of the scanning driving circuit 301. And the driving signal can also be inputted to the scanning driving circuit 302 by itself. The multiplexer 303 collects the test signals by using the switching signal of the multiplex control circuit 301 and transfers the image signal to the picture display region 304. The picture display region 304 determines the position of the display picture by the driving signal of the driving circuit 302 and the test signal from multiplexer 303. And the picture would be shown by the image signals from multiplexer 303. It should be noted that the pixel units are not shown in the picture display region. However, one of ordinary skill in the art should know a complete dots matrix display and the structure of the surrounding circuit. A plurality of signal lines includes the signal carrying different color signals. For example, when the test signals are transferred from the test points to the multiplexer and the test signal was inputted to a signal line by the multiplexer, there are usually three sets to display the red signal, green signal or blue signal in the signal line.

Figure 4:
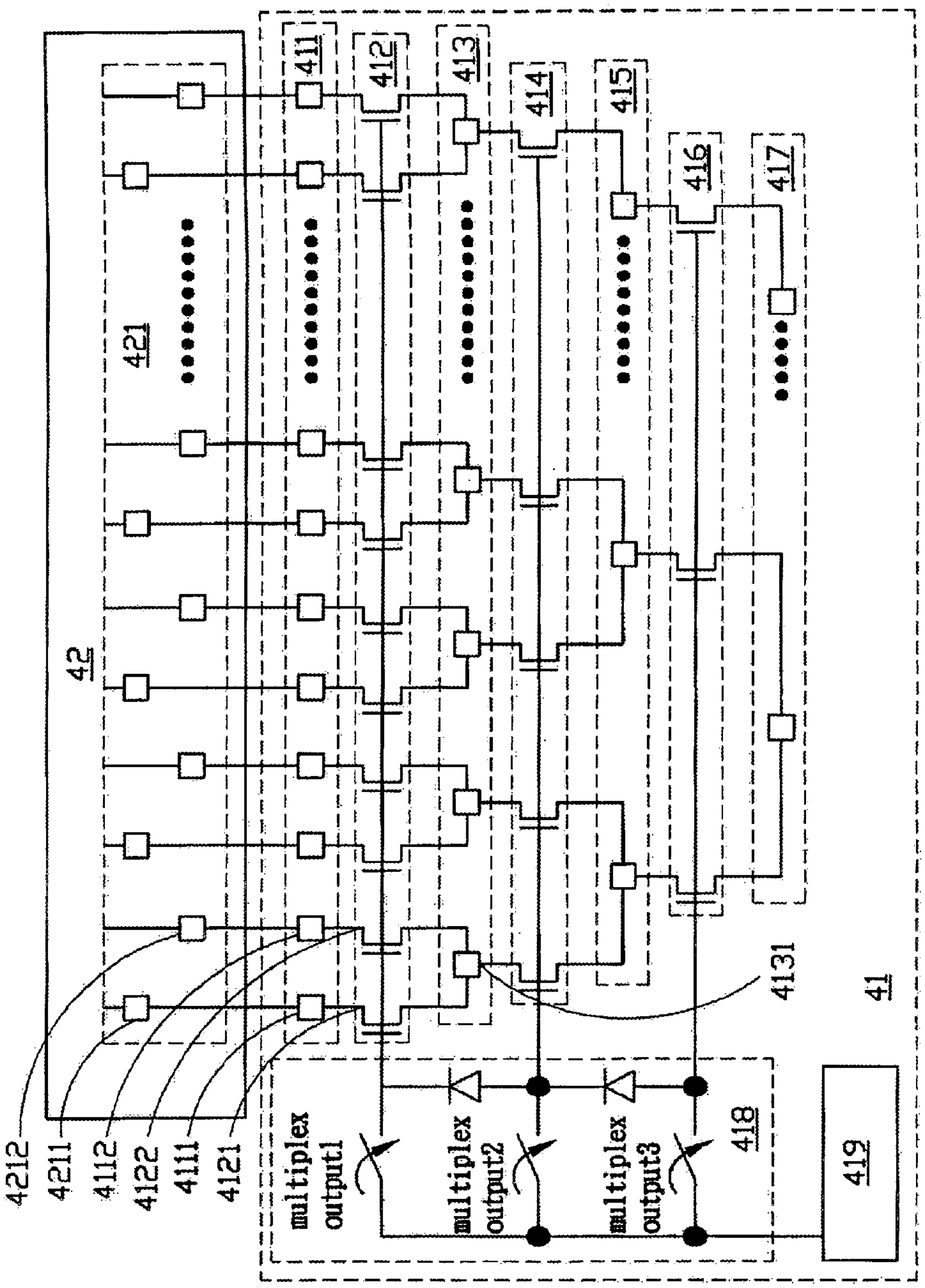
FIG. 4 is a view drawing illustrating a multiplexer of a display test system and a portion of the multiplex control circuit.

FIG. 4 is a view drawing illustrating the multiplexer 42 and a portion circuit of the multiplex control circuit in the test system of the display. The multiplexer 42 includes IC pad set 421 for using electrically connected to the panel. The IC pad sets includes a plurality IC pads whose number is determined by the resolution of the picture display region and the pitch is determined by the size of IC. In order to simplify the description, the following example will use IC pad 4211 and IC pad 4212 to describe. In the drawing, the test point set 411, test point set 413, test point set 415, and test point set 417 of the multiplexer control circuit are not showing all of the test points. There are only test point 4111 and test point 4112 being chosen in the following description. And the switch set 412, switch set 414, and switch set 416 are not shown all of the switches, and there are only switch 4121 and switch 4122 being chosen in the following description. The number of the test point set 411 and the IC pad set 421 are the same and are corresponding each other. It should be noted that the interval of the test points 4111 and test points 4112 is flexible and adjustable. A proper interval is adjusted within the useful region to provide the probe card test in a system. For example, when the production of the probe card is hard to fix 30 mm of the interval of the test point set, the test point set 411 adjust its interval to be 50 mm to fix the productive standard of the probe card. Moreover, when the test method is to input image signals from the probe card to the test point set 411, it is substantially identical to the method of the full contact test. The method is not only to test the drawback of the pixel by the monocolor picture but also to achieve the purpose of test quality of the panel by showing the gray scale, cross talk, or flicker pattern in the panel.

Figure 5:
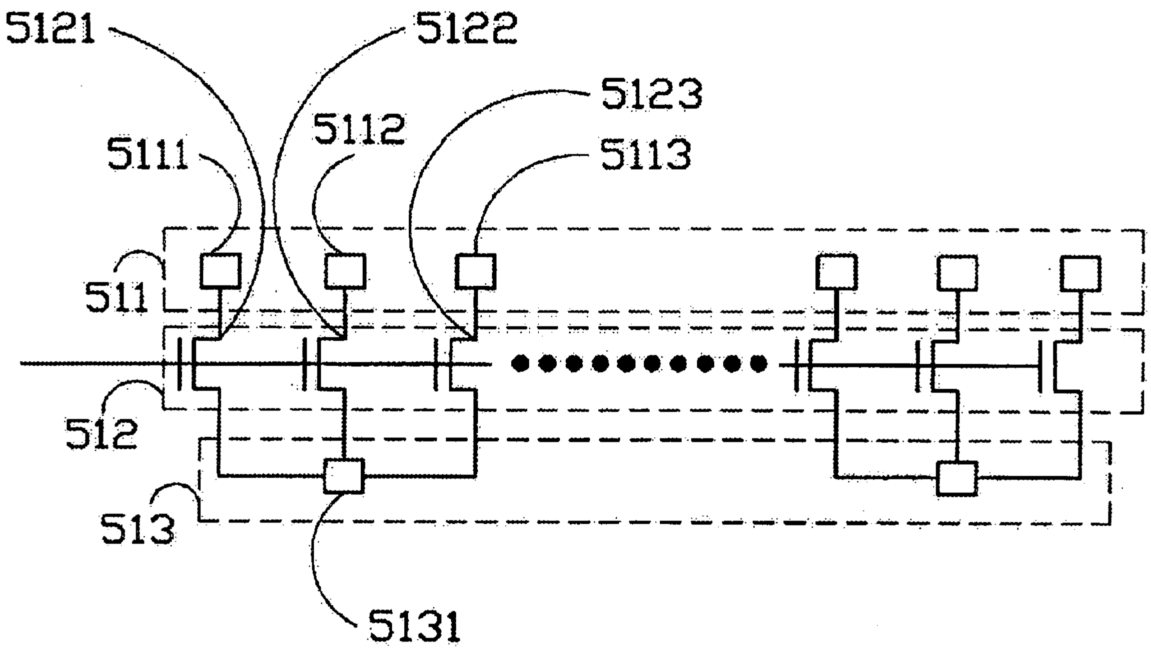
FIG. 5 is a view drawing illustrating another portion of the multiplex control circuit in the test system of the display of the present invention.

And the switch set 412 is controlled by the control circuit 418. The switch set is electrically connected to the test point set 411 and the test point set 413. For example, the test point 4111 is through the switch 4121 electrically connected to the test point 4131. The switch 4121, in the present embodiment of the invention, can be an NMOS TFT device or a PMOS TFT device. It is not limited that the test point set 411 is through the switch set 412 electrically connected to the test point set 413. In the present embodiment, the test point 4111 and test point 4112 are through the switch 4121 and switch 4122 electrically connected to the test point 4113, respectively. Therefore, the number of the test point set 413 is half of the number of the test point set 411. Of course, the number of the test point set 413 may also be one third of the number of the test point set 411. Referring to FIG. 5, in the present embodiment, the test point set 511 includes test points 5111, test points 5112, and test points 5113. The test points 5111, test points 5112, and test points 5113 are through the switches 5121, switches 5122 and switches 5123 of the switch set 512 electrically connected to the test point 5131, respectively. It should be noted from the structure that the number of the test point set 513 is one third of the number of the test point set 511. That means that the test point set 511 and test point set 513 are connected by the switch, but the number of the test point set 513 is determined by the need of the customers. For example, when the customers need more accurate reports to maintain the quality of the products, more test point sets can be used (such as test point set 511). Or when customers request to reduce the cost of the production and only want to test the main function of the products, then fewer test point sets can be used (such as test point sets 513). Therefore, the numbers of the test points are determined by the test function of the completeness and the test speed. Furthermore, to develop a layer structure control signals are included in the applications of the present invention. Still referring to FIG. 4, the test point set 413 is through the switch set 414 electrically connected to the test point set 415 and the test point set 415 is through the switch set 416 electrically connected to the test point set 417.

The test mode signal 419 is inputted into the control circuit 418 to determine which test point set can be use. In the present embodiment of the invention, the test point set 411 is used to test and the multiplex output 1, multiplex output 2 and multiplex output 3 of the control circuit are not activated. In another embodiment of the present invention, the test point set 413 is used to test, and multiplex output 2 and multiplex output 3 of the control circuit are not activated. For example, when the switch sets 412, switch set 414, and switch set 416 are the switches consist of NMOS, the test mode signal 419 is a high voltage (logic 1), the multiplex output 1 is closed (short), the multiplex output 2 and the multiplex output 3 are opened disconnected. It should be noted from the circuit structure that the switch 4121 and switch 4122 are turned on, and the test point 4111 and test point 4112 are short to be connected to the test point 4131. It is appreciated that the test mode signal is used to determine which test point being used to test in the present invention. And the test mode signal 419 is limited to be usually in high voltage (logic 1). For example, when the switch signal is a PMOS, the test mode signal 419 is in low voltage (logic 0).

Figure 6:
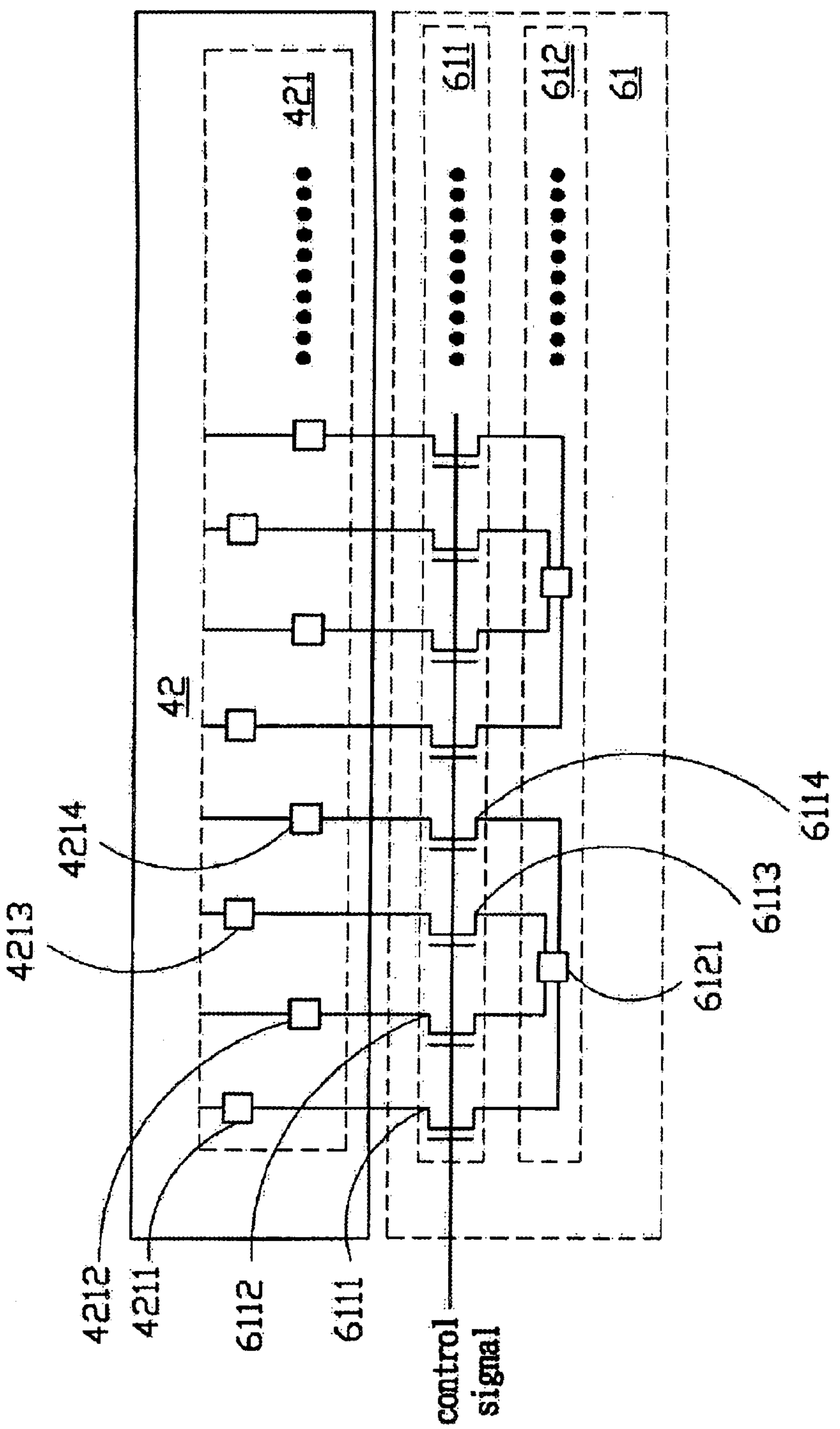
FIG. 6 is a view drawing illustrating the other one portion of the multiplex control circuit in the test system of the display of the present invention.

Referring to FIG. 6, is another embodiment of the present invention, the multiplexer includes IC pads for using electrically connected to the contact windows of the other systems. The IC pad set 421 includes a plurality of IC pads. In order to simplify the description, there are only IC pad 4211, IC pad 4212, IC pad 4213, and IC pad 4214 described herein. The multiplex control circuit 61 includes a switch set 6111, switch set 6112, switch set 6113, switch set 6114, and the test point 6121 to describe. The control signal turns on the switch 611 in the present embodiment, and the switch 6111, switch 6112, switch 6113 and switch 6114 are conducted. And the IC pad

4211, IC pad 4212, IC pad 4213, and IC pad 4214 are through the switch 6111, switch 6112, switch 6113, and switch 6114 electrically conducted to the test point 6121. Finally, the test signal is inputted into the test point 6121. It is necessary to describe that there is no limited through the switch sets electrically connected to the IC pad sets and test points. There may be two or five IC pads electrically connected to a test point. How many IC pads needed to be connected is determined by the users' need of the quality of the products and the cost of the test. And the multiplexer can be made by the low temperature poly-silicon (LTPS) process to form on the substrate.

The foregoing description is not intended to be exhaustive or to limit the present invention to the precise forms disclosed. Obvious modifications or variations are possible in light of the above teachings. In this regards, the embodiment or embodiments discussed were chosen and described to provide the best illustration of the principles of the present invention and its practical application to thereby enable one of ordinary skill in the art to utilize the present invention in various embodiments and with various modifications as are suited to the particular use contemplated. All such modifications and variations are within the scope of the present invention as determined by the appended claims when interpreted in accordance with the breadth to which they are fairly and legally entitled.

We claim:

1. A display, comprising:

a substrate;

a plurality of signal lines disposed on said substrate;

a driving circuit, comprising:

a plurality of integrated circuit (IC) pads, each of said IC pads being electrically connected to one of said signal lines;

a multiplexer, disposed between said signal lines and said IC pads, directly connected with said signal lines, and adapted to transmit a test signal to a portion of said signal lines;

a plurality of first test points disposed on said substrate— and electrically connected to said plurality of IC pads;

a plurality of second test points disposed on the substrate electrically connected to said plurality of IC pads and said plurality of first switches;

a plurality of second switches electrically connected to said plurality of first test points and said plurality of IC pads, wherein the number of said plurality of second switches is less than the number of said plurality of IC pads; and a plurality of first switches electrically connected to said plurality of first test point and said plurality of IC pads, wherein the number of said plurality of first test points is connected to a predetermined number of said IC pads respectively through said predetermined number of said first switches, and said predetermined number is larger than one.

2. The display of claim 1, wherein said plurality of first switches comprise a PMOS.

3. The display of claim 1, wherein said plurality of first switches comprise an NMOS.

4. The display of claim 1, wherein the number of said plurality of second test points is identical to the number of said plurality of IC pads.

5. The display of claim 1, wherein said plurality of signal lines include a plurality of first signal lines, a plurality of second signal lines, and a plurality of third signal lines.

6. The display of claim 5, wherein said multiplexer transmits said test signal to said plurality of first signal lines, second signal lines, or third signal lines.

7. The display of claim 5, wherein said plurality of first signal lines are adapted for transmitting a red display signals.

8. The display of claim 5, wherein said plurality of second signal lines are adapted for transmitting a green display signals.

9. The display of claim 5, wherein said plurality of third signal lines are adapted for transmitting a blue display signals.

10. The display of claim 6, wherein said multiplexer is made of low temperature poly-silicon (LTPS).

* * * * *